(12) United States Patent
Fukudome et al.

(10) Patent No.: US 11,476,847 B2
(45) Date of Patent: Oct. 18, 2022

(54) SEMICONDUCTOR DEVICE DRIVE CIRCUIT

(71) Applicant: Mitsubishi Electric Corporation, Tokyo (JP)

(72) Inventors: Jun Fukudome, Tokyo (JP); Kazuya Hokazono, Tokyo (JP); Mitsutaka Hano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/474,726

(22) Filed: Sep. 14, 2021

(65) Prior Publication Data

US 2022/0190823 A1 Jun. 16, 2022

(30) Foreign Application Priority Data

Dec. 15, 2020 (JP) ............................. JP2020-207477

(51) Int. Cl.
| | |
|---|---|
| *H03K 3/00* | (2006.01) |
| *H03K 3/037* | (2006.01) |
| *H03K 17/06* | (2006.01) |
| *H03K 17/16* | (2006.01) |
| *H02M 1/08* | (2006.01) |
| *H03K 17/687* | (2006.01) |
| *H03K 19/0185* | (2006.01) |
| *H03K 19/0944* | (2006.01) |

(52) U.S. Cl.
CPC ... *H03K 17/687* (2013.01); *H03K 19/018507* (2013.01); *H03K 19/0944* (2013.01)

(58) Field of Classification Search
None
See application file for complete search history.

(56) References Cited

U.S. PATENT DOCUMENTS

| | | | | |
|---|---|---|---|---|
| 8,779,806 | B2 * | 7/2014 | Tseng | H03K 3/013 |
| | | | | 327/333 |
| 8,975,944 | B2 * | 3/2015 | Akahane | H03K 3/356182 |
| | | | | 326/62 |
| 9,325,317 | B2 * | 4/2016 | Akahane | H03K 19/018521 |

(Continued)

FOREIGN PATENT DOCUMENTS

| | | |
|---|---|---|
| JP | H09-172366 A | 6/1997 |
| WO | 2012/043750 A1 | 4/2012 |
| WO | 2017/159058 A1 | 9/2017 |

*Primary Examiner* — Kenneth B Wells (74) *Attorney, Agent, or Firm* — Studebaker & Brackett PC (57) ABSTRACT

An object of the present disclosure is to provide a semiconductor device drive circuit stably preventing an erroneous operation in accordance with an application of dV/dt. A semiconductor device drive circuit includes: pulse transmission circuits outputting an on-pulse transmission signal and an off-pulse transmission signal based on a level shift on-pulse signal and a level shift off-pulse signal; a dV/dt detection circuit detecting a dV/dt period based on the level shift on-pulse signal and the level shift off-pulse signal; a logic filter circuit which does not change outputs when both the on-pulse transmission signal and the off-pulse transmission signal are input; and a latch circuit outputting a signal synchronized with an output of the logic filter circuit. The pulse transmission circuit includes impedance adjusting parts reducing a signal level of the on-pulse transmission signal and the off-pulse transmission signal during the dV/dt period.

2 Claims, 8 Drawing Sheets

(56) References Cited

U.S. PATENT DOCUMENTS

| | | | |
|---|---|---|---|
| 9,755,673 B2 * | 9/2017 | Hellmann | H04B 17/101 |
| 9,979,397 B1 * | 5/2018 | Zhu | H03K 5/19 |
| 10,063,226 B2 * | 8/2018 | Akahane | H03K 19/0948 |
| 10,833,655 B2 * | 11/2020 | Chang | H03K 3/012 |
| 10,855,273 B2 * | 12/2020 | Li | H03K 17/063 |
| 11,309,893 B2 * | 4/2022 | Akahane | H03K 17/687 |
| 2012/0081149 A1 | 4/2012 | Akahane | |
| 2018/0191340 A1 | 7/2018 | Akahane | |

* cited by examiner

SEMICONDUCTOR DEVICE DRIVE CIRCUIT

BACKGROUND OF THE INVENTION

Field of the Invention

The present disclosure relates to a semiconductor device drive circuit.

Description of the Background Art

An error signal occurs in accordance with a variation of secondary side reference potential VS in a semiconductor device drive circuit associated with a level shift from a primary side circuit to a secondary side circuit in some cases. The variation of the secondary side reference potential VS is also represented as dV/dt hereinafter. International Publication No. 2017/159058 discloses a method of adjusting impedance of a level shift circuit at a time of dV/dt to suppress the occurrence of the error signal.

SUMMARY

According to the method disclosed in International Publication No. 2017/159058, the impedance itself of the level shift circuit is adjusted at the time of dV/dt. A dV/dt detection circuit receives an output signal from the level shift circuit, detects a dV/dt period, and outputs the dV/dt period to an impedance adjusting part. The dV/dt detection circuit receives a feedback caused by a drive of the impedance adjusting part, thus there is a problem that the dV/dt detection circuit cannot stably detect the dV/dt period, and the output of the level shift circuit becomes unstable.

An object of a technique of the present disclosure is to provide a semiconductor device drive circuit stably preventing an erroneous operation at a time of dV/dt.

A semiconductor device drive circuit according to the present disclosure includes a pulse generation circuit, an on-side level shift circuit, an off-side level shift circuit, an on-side pulse transmission circuit, an off-side pulse transmission circuit, a dV/dt detection circuit, a logic filter circuit, and a latch circuit. The pulse generation circuit outputs an on-pulse signal synchronized with a leading edge of an input signal and an off-pulse signal synchronized with a falling edge. The on-side level shift circuit outputs a level shift on-pulse signal in which a level of reference potential of the on-pulse signal is shifted from primary side reference potential to secondary side reference potential. The off-side level shift circuit outputs a level shift off-pulse signal in which a level of reference potential of the off-pulse signal is shifted from primary side reference potential to secondary side reference potential. The on-side pulse transmission circuit outputs an on-pulse transmission signal based on the level shift on-pulse signal. The off-side pulse transmission circuit outputs an off-pulse transmission signal based on the level shift off-pulse signal. The dV/dt detection circuit detects a dV/dt period which is a variation period of the secondary side reference potential based on the level shift on-pulse signal and the level shift off-pulse signal. The logic filter circuit is provided in a latter stage of the on-side pulse transmission circuit and the off-side pulse transmission circuit, and does not change an output when both the on-pulse transmission signal and the off-pulse transmission signal are input. The latch circuit outputs a signal synchronized with an output of the logic filter circuit. The on-side pulse transmission circuit includes an on-side impedance adjusting part. The on-side impedance adjusting part reduces a signal level of the on-pulse transmission signal during the dV/dt period. The off-side pulse transmission circuit includes an off-side impedance adjusting part. The off-side impedance adjusting part reduces a signal level of the off-pulse transmission signal during the dV/dt period.

The semiconductor device drive circuit according to the present disclosure reduces the signal level of the on-pulse transmission signal and the off-pulse transmission signal during the dV/dt period, thereby preventing erroneously drive of a semiconductor device. The on-pulse transmission signal and the off-pulse transmission signal are not input to the dV/dt detection circuit, thus the dV/dt period can be stably detected. Accordingly, an erroneous operation at the time of dV/dt can be stably prevented.

These and other objects, features, aspects and advantages of the present invention will become more apparent from the following detailed description of the present invention when taken in conjunction with the accompanying drawings.

DESCRIPTION OF THE PREFERRED EMBODIMENTS

A. Comparison Example

Figure 1:
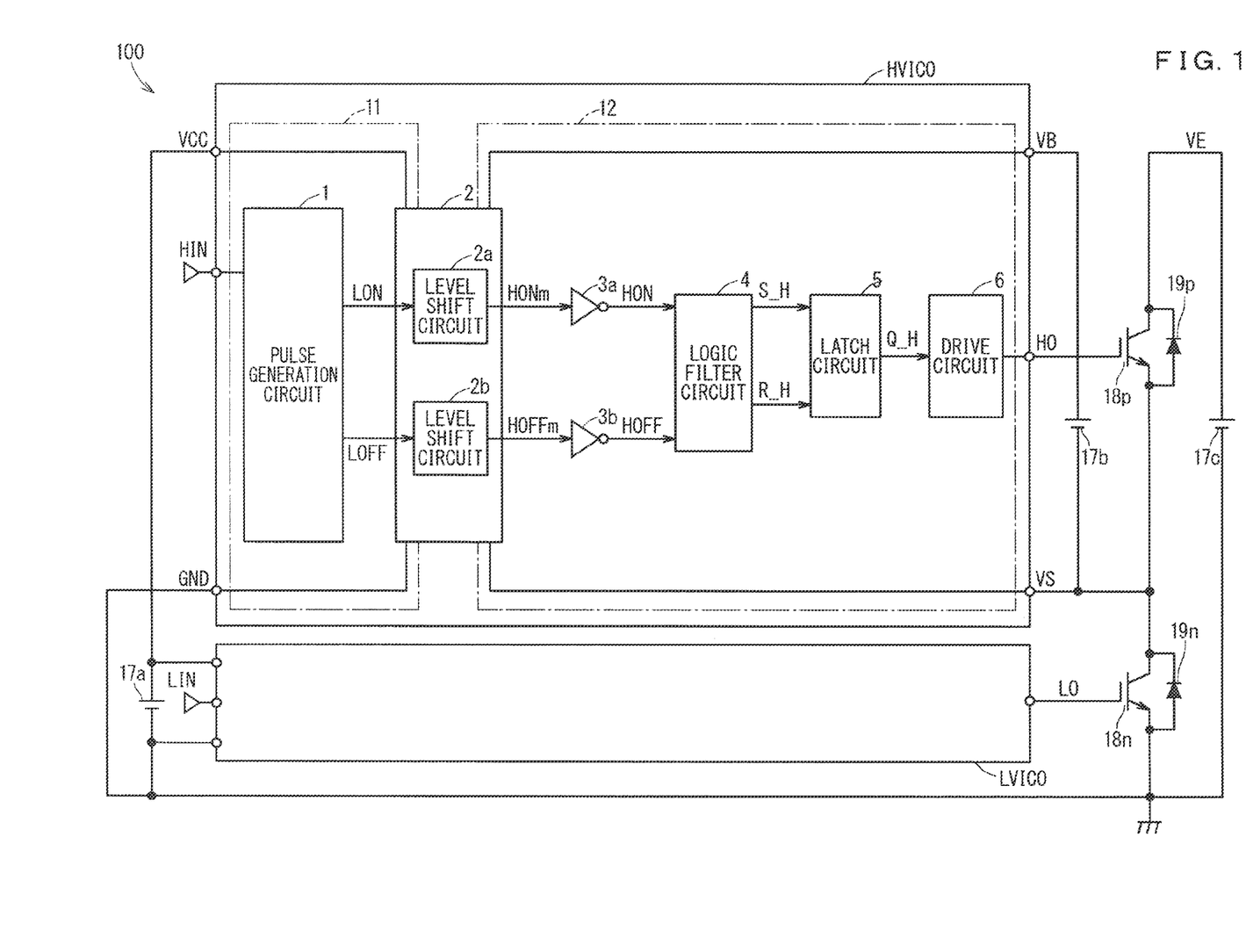
FIG. 1 A circuit block diagram illustrating a configuration of a half-bridge circuit of a comparison example.

FIG. 1 is a circuit block diagram illustrating a configuration of a half-bridge circuit 100 of a comparison example. The half bridge circuit 100 includes an insulated gate bipolar transistor (IGBT) 18$p$ which is a P-side switching element, an IGBT 18$n$ which is an N-side switching element, and semiconductor device drive circuits HVIC0 and LVIC0.

The semiconductor device drive circuit HVIC0 includes a primary side circuit 11 operating based on primary side reference potential GND and a secondary side circuit 12 operating based on secondary side reference potential VS. The semiconductor device drive circuit HVIC0 receives an input signal HIN which is based on the primary side reference potential GND, outputs a high-side drive signal HO which is based on the secondary side reference potential VS, and drives the IGBT 18$p$ operating based on the secondary side reference potential VS as reference potential. The semiconductor device drive circuit LVIC0 receives an input signal LIN which is based on the primary side reference potential GND, outputs a signal low-side drive signal LO synchronized with the input signal LIN, and drives the IGBT 18n.

A power source 17a is connected between the primary side circuit 11 of the semiconductor device drive circuit HVIC0 and the primary side reference potential GND and between the semiconductor device drive circuit LVIC0 and the primary side reference potential GND. That is to say, the primary side circuit 11 of the semiconductor device drive circuit HVIC0 and the semiconductor device drive circuit LVIC0 are driven by power source potential VCC from the power source 17a. A power source 17b is connected between the secondary side circuit 21 of the semiconductor device drive circuit HVIC0 and the secondary side reference potential VS. That is to say, the secondary side circuit 21 of the semiconductor device drive circuit HVIC0 is driven by power source potential VB from the power source 17b. A power source 17c is connected between a collector of the IGBT 18p and a GND. That is to say, power source potential VE is applied by the power source 17c to the collector of the IGBT 18p.

The semiconductor device drive circuit HVIC0 includes a pulse generation circuit 1, a level shift circuit 2, invertors 3a and 3b, a logic filter circuit 4, a latch circuit 5, and a drive circuit 6. The pulse generation circuit 1 and a primary side of the level shift circuit 2 constitute the primary side circuit 11, and a secondary side of the level shift circuit 2, the invertors 3a and 3b, the logic filter circuit 4, the latch circuit 5, and the drive circuit 6 constitute the secondary side circuit 21.

The pulse generation circuit 1 receives the input signal HIN, and outputs an on-pulse signal LON synchronized with a leading edge of the input signal HIN and an off-pulse signal LOFF synchronized with a falling edge thereof.

The level shift circuit 2 includes a level shift circuit 2a which is an on-side level shift circuit and a level shift circuit 2b which is an off-side level shift circuit.

The level shift circuit 2a reverses the on-pulse signal LON, and shifts the level of the reference potential from the primary side reference potential GND to the secondary side reference potential VS, thereby outputting a level shift on-pulse signal HONm.

The level shift circuit 2b reverses the off-pulse signal LOFF, and shifts the level of the reference potential from the primary side reference potential GND to the secondary side reference potential VS, thereby outputting a level shift off-pulse signal HOFFm.

The invertor 3a receives the level shift on-pulse signal HONm, and reverses the level shift on-pulse signal HONm, thereby outputting the on-pulse transmission signal HON The invertor 3b receives the level shift off-pulse signal HOFFm, and reverses the level shift off-pulse signal HOFFm, thereby outputting the off-pulse transmission signal HOFF.

The logic filter circuit 4 is a circuit which does not receive any input and does not change the output when the on-pulse transmission signal HON and the off-pulse transmission signal HOFF are simultaneously input, that is to say, when both the signal levels of the on-pulse transmission signal HON and the off-pulse transmission signal HOFF are HIGH. The logic filter circuit 4 outputs S_H when only the on-pulse transmission signal HON is input, and outputs R_H when only the off-pulse transmission signal HOFF is input. That is to say, one output S_H of the logic filter circuit 4 is HIGH when the on-pulse transmission signal HON is HIGH and the off-pulse transmission signal HOFF is LOW, and the other output R_H is HIGH when the on-pulse transmission signal HON is LOW and the off-pulse transmission signal HOFF is HIGH.

The latch circuit 5 receives the S_H and the R_H, and outputs a signal Q_H rising in synchronization with a leading edge of the S_H and falling in synchronization with a leading edge of the R_H.

The drive circuit 6 outputs a high-side drive signal IO rising in synchronization with a leading edge of the Q_H and falling in synchronization with a falling edge of the Q_H.

Next, an erroneous operation caused by a variation of VS (dV/dt) is described.

Figure 2:
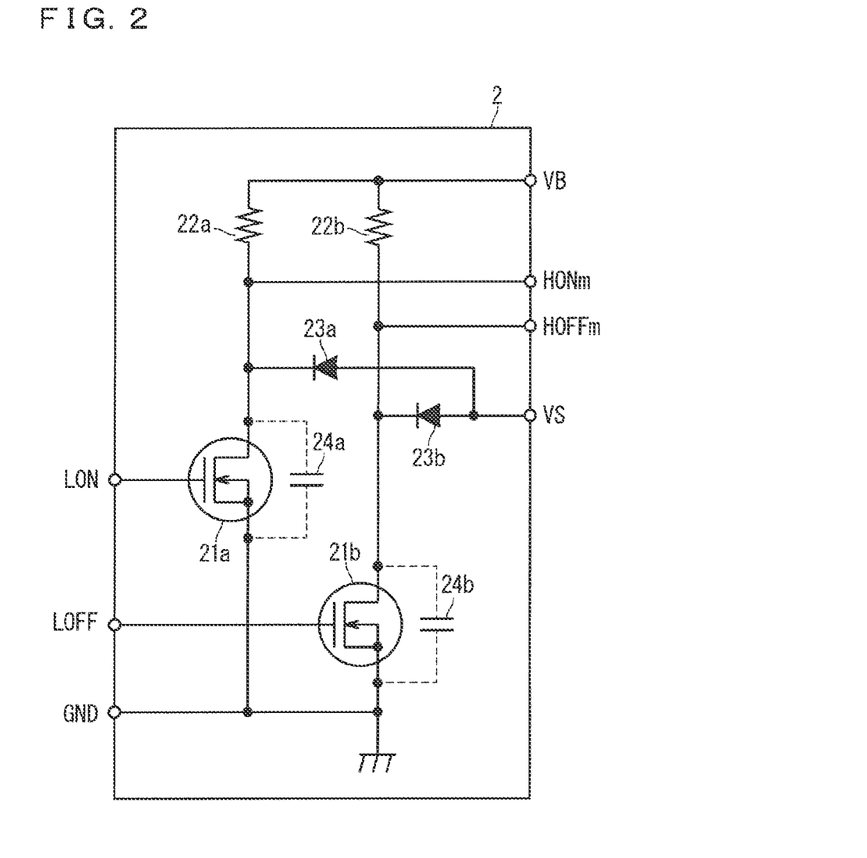
FIG. 2 A circuit diagram of a level shift circuit.

FIG. 2 is a circuit diagram of the level shift circuit 2. As illustrated in FIG. 2, the level shift circuit 2 includes high withstand voltage NMOSs 21a and 21b, resistances 22a and 22b, and diodes 23a and 23b.

A source of each of the high withstand voltage NMOSs 21a and 21b is connected to the primary side reference potential GND. The resistance 22a is connected between a drain of the high withstand voltage NMOS 21a and the power source potential VB, and the diode 23a is connected between a drain of the high withstand voltage NMOS 21a and the VS so that a cathode thereof is directed to the drain. The resistance 22b is connected between a drain of the high withstand voltage NMOS 21b and the power source potential VB, and the diode 23b is connected between a drain of the high withstand voltage NMOS 21b and the secondary side reference potential VS so that a cathode thereof is directed to the drain. Drain voltage of the high withstand voltage NMOS 21a becomes the level shift on-pulse signal HONm, and drain voltage of the high withstand voltage NMOS 21b becomes the level shift off-pulse signal HOFFm. The on-pulse signal LON is input to a gate of the high withstand voltage NMOS 21a, and the off-pulse signal LOFF is input to a gate of the high withstand voltage NMOS 21b.

The diode 23a has a role of preventing the potential of the level shift on-pulse signal HONm from being equal to or smaller than the secondary side reference potential VS, and the diode 23b has a role of preventing the potential of the level shift off-pulse signal HOFFm from being equal to or smaller than the secondary side reference potential VS.

When both the signal levels of the on-pulse signal LON and the off-pulse signal LOFF are HIGH, both the high withstand voltage NMOSs 21a and 21b become conductive, and the signal levels of the level shift on-pulse signal HONm and the level shift off-pulse signal HOFFm make a transmission from HIGH to LOW.

At the time of dV/dt when the secondary side reference potential VS varies, the power source potential VB which is larger than the secondary side reference potential VS by the power source voltage of the power source 17b also varies in accordance with VS. Then, the high withstand voltage NMOSs 21a and 21b have parasitic capacitances 24a and 24b, respectively, thus displacement current deriving from the parasitic capacitances 24a and 24b flows via the resistances 22 and 22b. Accordingly, during dV/dt period, when the on-pulse signal LON and the off-pulse signal LOFF are not input, that is to say, even when both the signal levels of the on-pulse signal LON and the off-pulse signal LOFF are LOW, the signal levels of the level shift on-pulse signal HONm and the level shift off-pulse signal HOFFm are LOW.

A slight difference occurs in a time when the signal levels of the level shift on-pulse signal HONm and the level shift off-pulse signal HOFFm return from LOW deriving dV/dt to HIGH in accordance with a manufacture tolerance or a charge state of the parasitic capacitances 24a and 24b. Thus, there is a case where LOW deriving from dV/dt of the level shift on-pulse signal HONm or the level shift off-pulse signal HOFFm cannot be removed by the logic filter circuit 4 in a latter stage. For example, in a case where dV/dt occurs when the high-side drive signal HO is LOW, and the signal level of the level shift on-pulse signal HONm returns from LOW to HIGH later than the signal level of the level shift off-pulse signal HOFFm after the signal levels of the level shift on-pulse signal HONm and the level shift off-pulse signal HOFFm become LOW, the logic filter circuit 4 cannot remove the on-pulse transmission signal HON, which is HIGH, deriving from the level shift on-pulse signal HONm, which is LOW, and thus outputs S_H of HIGH level. As a result, the high-side drive signal HO becomes HIGH, and there is a possibility that the IGBT 18p is erroneously turned on. In the similar manner, in a case where dV/dt occurs when the high-side drive signal HO is HIGH, and the signal level of the level shift off-pulse signal HOFFm returns from LOW to HIGH later than the signal level of the level shift on-pulse signal IHONm after the signal levels of the level shift on-pulse signal HONm and the level shift off-pulse signal IOFFm become low, the logic filter circuit 4 cannot remove the on-pulse transmission signal HOFF, which is HIGH, deriving from the level shift on-pulse signal HOFFm, which is LOW, and thus outputs R_H of HIGH level. As a result, the high-side drive signal HO becomes LOW, and there is a possibility that the IGBT 18p is erroneously turned off.

For example, International Publication No. 2012/043750 or International Publication No. 2017/159058 discloses a method of changing impedance of a level shift circuit at a time of dV/dt for a purpose of suppressing such an erroneous operation. For example, a semiconductor device drive circuit disclosed in International Publication No. 2012/043750 detects a dV/dt period using a dV/dt detection circuit, and reduces impedance of a level shift circuit on an on side and off side during the dV/dt period, thereby reducing a signal level of an output of the level shift circuit.

However, in the semiconductor device drive circuit disclosed in International Publication No. 2012/043750, the dV/dt detection circuit receives the output of the level shift circuit, thus the dV/dt detection circuit does not output a dV/dt detection signal after the signal level of the level shift circuit decreases. Then, the impedance of the level shift circuit returns to the original state, thus the level shift circuit outputs the signal again, and the dV/dt detection circuit outputs the dV/dt detection signal again. As described above, there is a problem that the dV/dt detection circuit cannot stably detect the dV/dt period, and the output of the level shift circuit becomes unstable. An object of the present disclosure is to prevent an oscillation operation of a level shift circuit.

B. Embodiment 1

B-1. Configuration

Figure 3:
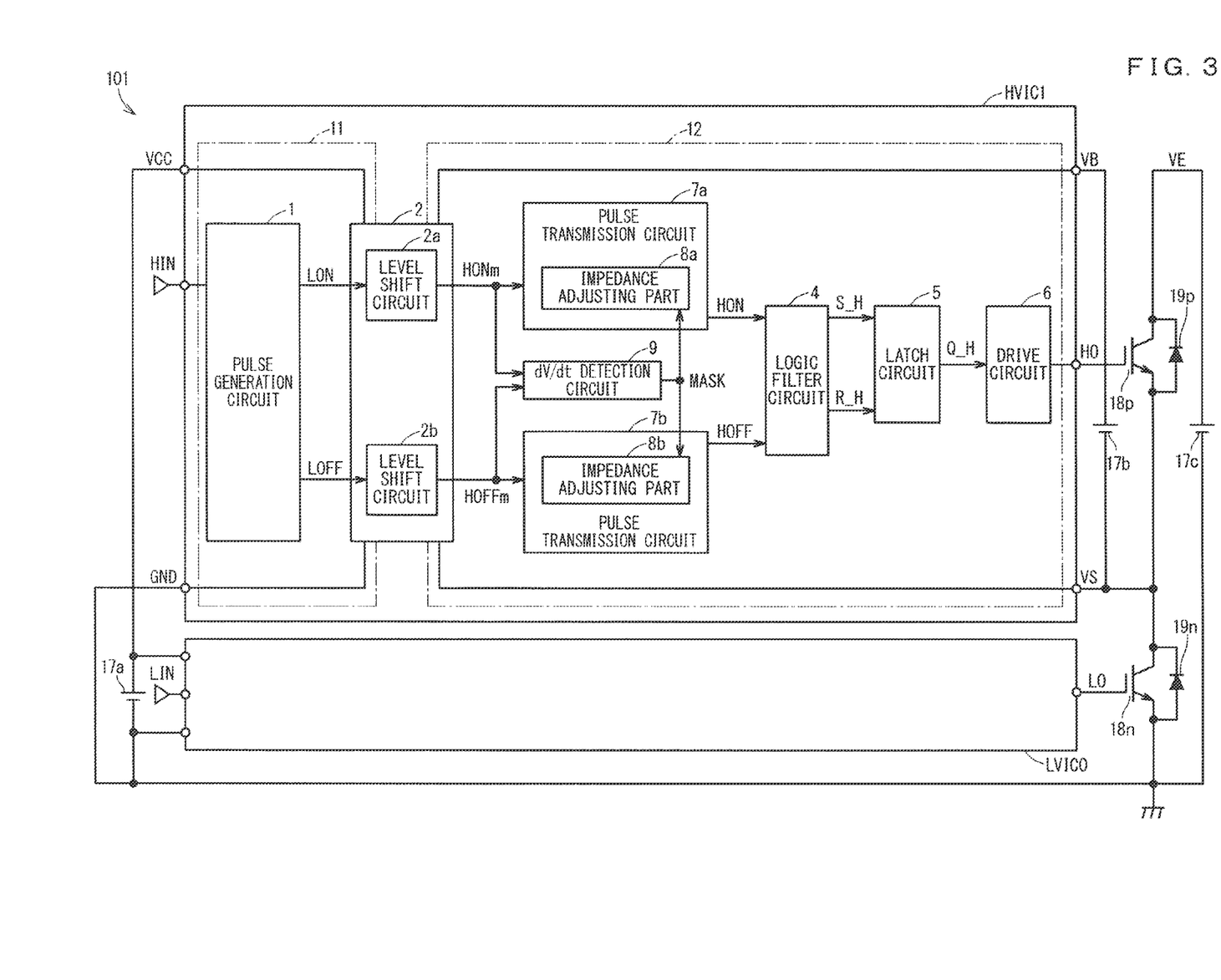
FIG. 3 A circuit block diagram illustrating a configuration of a half-bridge circuit using a semiconductor device drive circuit according to an embodiment 1.

FIG. 3 is a circuit block diagram illustrating a configuration of a half-bridge circuit 101 using a semiconductor device drive circuit HVIC1 according to an embodiment 1. The half-bridge circuit 101 has a configuration that the semiconductor device drive circuit HVIC0 of the half bridge circuit 100 of the comparison example is replaced with the semiconductor device drive circuit HVIC1. The semiconductor device drive circuit HVIC1 is different from the semiconductor device drive circuit HVIC0 of the comparison example in that the semiconductor device drive circuit HVIC1 includes pulse transmission circuits 7a and 7b and a dV/dt detection circuit 9 in place of the invertors 3a and 3b.

The pulse transmission circuit 7a is provided on an on side, and receives a level shift on-pulse signal HONm which is an output signal of the level shift circuit 2a. Then, the pulse transmission circuit 7a outputs a reversed signal of the level shift on-pulse signal HONm as the on-pulse transmission signal HON when the secondary side reference potential VS does not fluctuate. The pulse transmission circuit 7a includes an impedance adjusting part 8a. The pulse transmission circuit 7a is also referred to as an on-side pulse transmission circuit, and the impedance adjusting part 8a is also referred to as an on-side impedance adjusting part.

The pulse transmission circuit 7b is provided on an off side, and receives a level shift off-pulse signal HOFFm which is an output signal of the level shift circuit 2a. Then, the pulse transmission circuit 7b outputs a reversed signal of the level shift off-pulse signal HOFFm as the off-pulse transmission signal HOFF when the secondary side reference potential VS does not fluctuate. The pulse transmission circuit 7b includes an impedance adjusting part 8b. The pulse transmission circuit 7b is also referred to as an off-side pulse transmission circuit, and the impedance adjusting part 8a is also referred to as an off-side impedance adjusting part.

The dV/dt detection circuit 9 receives the level shift on-pulse signal HONm and the level shift off-pulse signal HOFFm. The dV/dt detection circuit 9 detects a dV/dt period from the level shift on-pulse signal HONm and the level shift off-pulse signal HOFFm, and outputs a mask signal MASK to the impedance adjusting parts 8a and 8b during the dV/dt period. That is to say, a signal level of the mask signal MASK is HIGH during the dV/dt period, and is LOW in a period other than the dV/dt period. Upon receiving the mask signal MASK of HIGH level, the impedance adjusting parts 8a and 8b reduce the impedance of the pulse transmission circuits 7a and 7b, and suppress the on-pulse transmission signal HON and the off-pulse transmission signal HOFF, each of which is an output of the pulse transmission circuits 7a and 7b, that is to say, make the signal level of them LOW.

As described above, the semiconductor device drive circuit HVIC1 changes the impedance of not the level shift circuits 2a and 2b but the pulse transmission circuits 7a and 7b at the time of dV/dt, thereby suppressing an erroneous output of the IGBT 18p deriving from dV/dt. The on-pulse transmission signal HON and the off-pulse transmission signal HOFF, each of which is the output signal of the pulse transmission circuits 7a and 7b, are not input to the dV/dt detection circuit 9, thus the dV/dt detection circuit 9 stably outputs signal even when the impedance of the pulse transmission circuits 7a and 7b is changed. Accordingly, the occurrence of the erroneous signal deriving from dV/dt is stably suppressed.

B-2. Detailed Configuration

Figure 4:
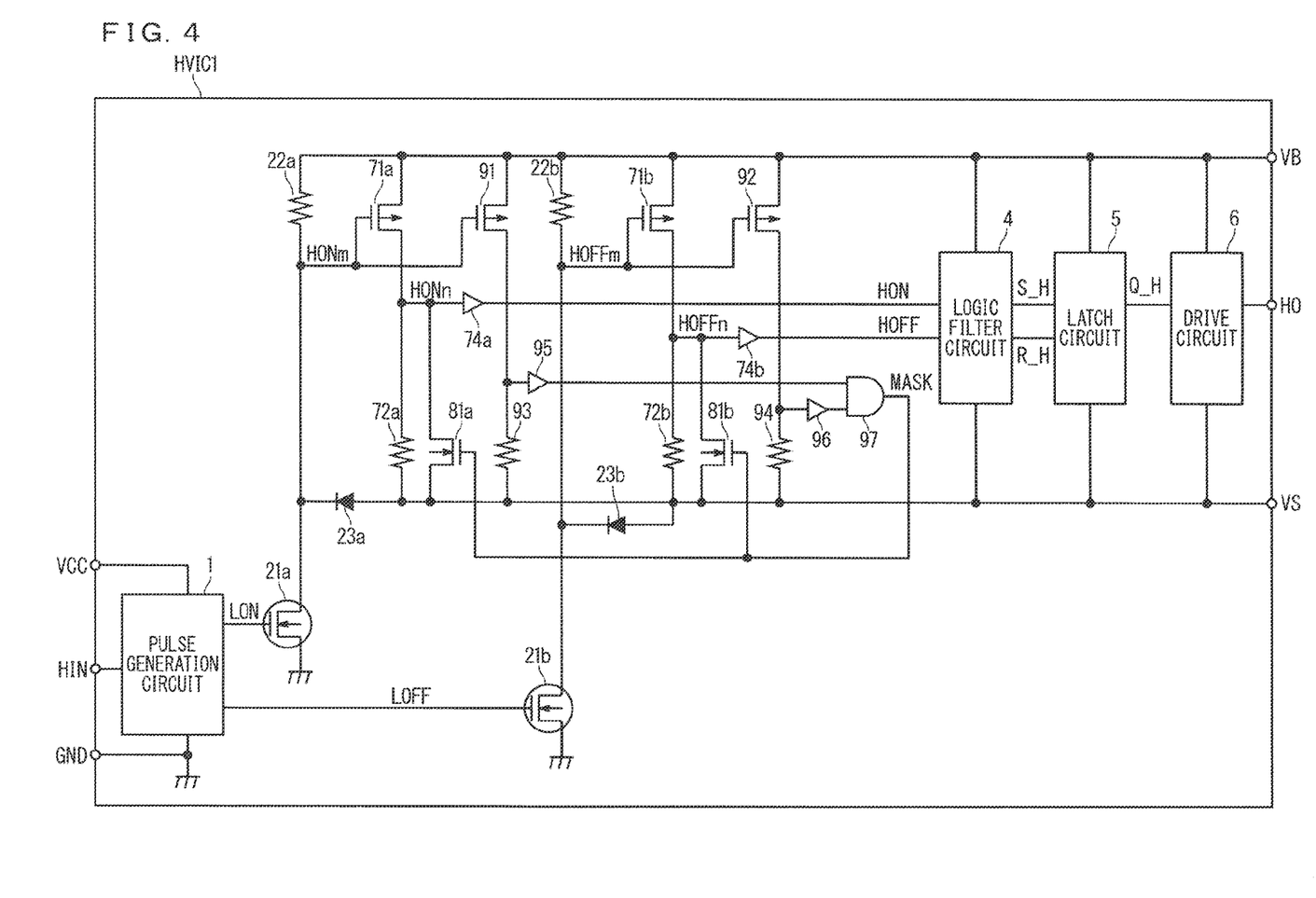
FIG. 4 A circuit diagram of the semiconductor device according to the embodiment 1.
Figure 5:
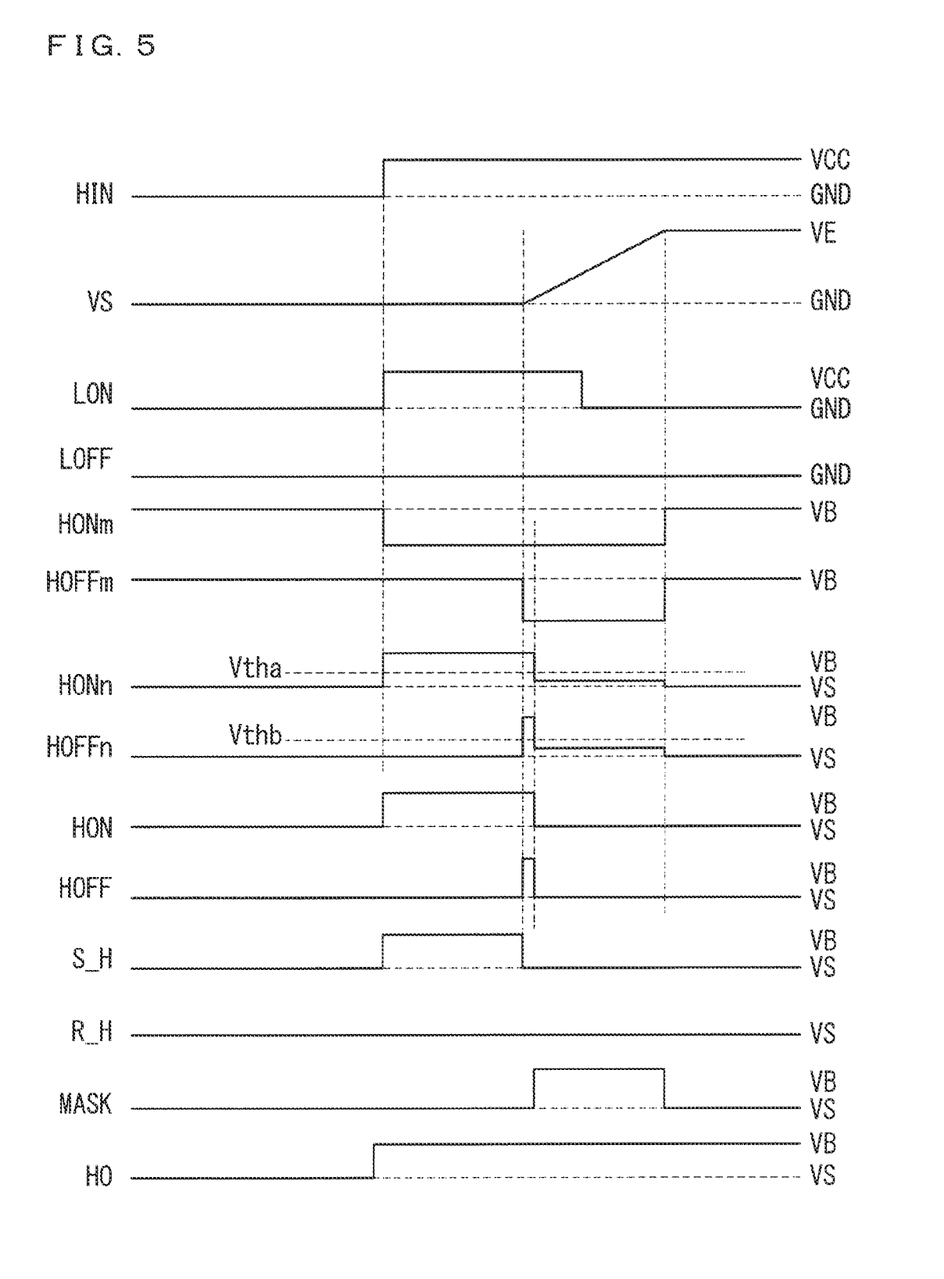
FIG. 5 A diagram illustrating a waveform of each signal at a time of dV/dt in the semiconductor device drive circuit according to the embodiment 1.

FIG. 4 is a circuit diagram of the semiconductor device drive circuit HVIC1. FIG. 5 illustrates a waveform of each signal at the time of dV/dt in the semiconductor device drive circuit HVIC1.

The pulse transmission circuit 7a includes a PMOS 71a, a resistance 72a, an NMOS 81a, and a buffer 74a. In this configuration, the NMOS 81a corresponds to the impedance adjusting part 8a. The level shift on-pulse signal HONm is input to a gate of the PMOS 71a. A source of the PMOS 71a is connected to the power source potential VB, and the resistance 72a, the NMOS 81a, and the buffer 74a are connected to a drain. One end of the resistance 72a is connected to the drain of the PMOS 71a, and the other end thereof is connected to the secondary side reference potential VS. A drain of the NMOS 81a is connected to the drain of the PMOS 71a, and a source of the NMOS 81a is connected to the secondary side reference potential VS. One end of the buffer 74a is connected to the drain of the PMOS 71a, and the other end thereof is connected to an input of the logic filter circuit 4.

The pulse transmission circuit 7b includes a PMOS 71b, a resistance 72b, an NMOS 81b, and a buffer 74b. In this configuration, the NMOS 81b corresponds to the impedance adjusting part 8b. The level shift off-pulse signal HOFFm is input to a gate of the PMOS 71b. A source of the PMOS 71b is connected to the power source potential VB, and the resistance 72b, the NMOS 81b, and the buffer 74b are connected to a drain. One end of the resistance 72b is connected to the drain of the PMOS 71b, and the other end thereof is connected to the secondary side reference potential VS. A drain of the NMOS 81b is connected to the drain of the PMOS 71b, and a source of the NMOS 81b is connected to the secondary side reference potential VS. One end of the buffer 74b is connected to the drain of the PMOS 71b, and the other end thereof is connected to the input of the logic filter circuit 4.

The dV/dt detection circuit 9 includes PMOSs 91 and 92, resistances 93 and 94, buffers 95 and 96, and an AND gate 97.

A source of the PMOS 91 is connected to the power source potential VB, and the level shift on-pulse signal HONm is input to a gate. The resistance 93 and the buffer 95 are connected to a drain of the PMOS 91. One end of the resistance 93 is connected to the drain of the PMOS 91, and the other end thereof is connected to the secondary side reference potential VS. One end of the buffer 95 is connected to the drain of the PMOS 91, and the other end thereof is connected to one input of the AND gate 97.

A source of the PMOS 92 is connected to the power source potential VB, and the level shift off-pulse signal HOFFm is input to a gate. The resistance 94 and the buffer 96 are connected to a drain of the PMOS 92. One end of the resistance 94 is connected to the drain of the PMOS 92, and the other end thereof is connected to the secondary side reference potential VS. One end of the buffer 96 is connected to the drain of the PMOS 92, and the other end thereof is connected to the other input of the AND gate 97.

An output of the AND gate 97 is a MASK signal, and is input to gates of the NMOSs 81a and 81b corresponding to the impedance adjusting parts 8a and 8b.

An operation in a case where the secondary side reference potential VS does not fluctuate is described firstly. The outputs LON and LOFF of the pulse generation circuit 1 do not simultaneously become HIGH, thus the signal level of the level shift on-pulse signal HONm of the level shift circuit 2a and the signal level of the level shift off-pulse signal HOFFm of the level shift circuit 2b do not simultaneously become LOW, but both of them become HIGH or only one of them becomes LOW. When the signal level of the level shift on-pulse signal HONm of the level shift circuit 2a is LOW and the signal level of the level shift off-pulse signal HOFFm of the level shift circuit 2b is HIGH, the following operation is achieved.

When the signal level of the level shift on-pulse signal HONm of the level shift circuit 2a is LOW, the PMOS 71a becomes conductive and current flows in the resistance 72a. Accordingly, a signal HONn which is a reversed signal of the level shift on-pulse signal HONm is input to the buffer 74a. The buffer 74a shapes the signal HONn, thereby outputting the on-pulse transmission signal HON to the logic filter circuit 4.

The level shift on-pulse signal HONm which is the output of the level shift circuit 2a is also input to the PMOS 91. When the signal level of the level shift on-pulse signal HONm is LOW, the PMOS 91 becomes conductive and current flows in the resistance 93. Accordingly, a reverse signal of the level shift on-pulse signal HONm is input to the buffer 95. As a result, the signal of HIGH level is input from the buffer 95 to one input terminal of the AND gate 97.

In the meanwhile, the signal level of the level shift off-pulse signal HOFFm is HIGH, thus the PMOS 92 is non-conductive, and the signal of LOW level is input from the buffer 96 to the other input terminal of the AND gate 97. Accordingly, the signal level of the mask signal MASK which is the output of the AND gate 97 becomes LOW.

When the signal level of the level shift on-pulse signal HONm of the level shift circuit 2a is HIGH and the signal level of the level shift off-pulse signal HOFFm of the level shift circuit 2b is LOW, the output level of the buffer 95 is LOW and the output level of the buffer 96 is HIGH in contrast to the case described above. Also in this case, the signal level of the mask signal MASK which is the output of the AND gate 97 becomes LOW.

An operation at the time of dV/dt is described next. The signal levels of the level shift on-pulse signal HONm and the level shift off-pulse signal HOFFm become simultaneously LOW at the time of dV/dt. In this case, the pMOSs 71a, 71b, 91, and 92 become simultaneously conductive, and current flows in the resistances 72a, 72b, 93, and 94. As a result, all of the output levels of the buffers 74a, 74b, 95, and % become HIGH. Both the output levels of the buffers 95 and 96 become HIGH, thus the signal level of the mask signal MASK which is the output of the AND gate 97 becomes HIGH. Then, the NMOSs 81a and 81b become conductive when the mask signal MASK is input to the gate, and the signal levels of HONn and TTOFFn decrease. When the signal levels of HONn and HOFFn get smaller than threshold values Vtha and Vthb of the buffers 74a and 74b, respectively, the signal levels of the on-pulse transmission signal HON and the off-pulse transmission signal HOFF, each of which is the output of the buffers 74a and 74b, become LOW. Herein, the signal level of the mask signal MASK is not influenced by the conduction of the NMOSs 81 and 81b, thus is stably HUGH during the dV/dt period.

According to the above operation, the semiconductor device drive circuit HVIC1 can suppress the occurrence of the erroneous signal deriving from dV/dt while stably outputting the level shift on-pulse signal HONm and level shift off-pulse signal HOFFm.

B-3. Modification Example

The logic filter circuit 4 may receive the mask signal MASK in addition to the on-pulse transmission signal HON and the off-pulse transmission signal HOFF. Also applicable is a configuration that the logic filter circuit 4 does not receive the input of the on-pulse transmission signal HON and the off-pulse transmission signal HOFF also in the case where the signal level of the mask signal MASK is HIGH in addition to the case where the signal levels of the on-pulse transmission signal ION and the off-pulse transmission signal HOFF are simultaneously HIGH.

In FIG. 1 and FIG. 3, the switching element which is a drive target of the semiconductor device drive circuit HVIC0 is the IGBT, however, an SiC-metal oxide semiconductor field effect transistor (MOSFET) is also applicable. An SiC-MOS is used for the switching element, VS fluctuates rapidly, and VS potential itself oscillates (ringing occurs), thus the configuration of the present disclosure is particularly effective.

B-4. Effect

The semiconductor device drive circuit HVIC1 according to the embodiment 1 includes: the pulse generation circuit 1 outputting the on-pulse signal LON synchronized with the leading edge of the input signal HIN and the off-pulse signal LOFF synchronized with the falling edge; the level shift circuit 2a outputting the level shift on-pulse signal HONm in which the level of reference potential of the on-pulse signal LON is shifted from the primary side reference potential GND to the secondary side reference potential VS; the level shift circuit 2b outputting the level shift off-pulse signal HOFFm in which the level of reference potential of the off-pulse signal LOFF is shifted from the primary side reference potential GND to the secondary side reference potential VS; the pulse transmission circuit 7a outputting the on-pulse transmission signal HON based on the level shift on-pulse signal HONm; the pulse transmission circuit 7b outputting the off-pulse transmission signal HOFF based on the level shift off-pulse signal HOFFm; the dV/dt detection circuit 9 detecting the dV/dt period which is the variation period of the secondary side reference potential VS based on the level shift on-pulse signal HONm and the level shift off-pulse signal HOFFm; the logic filter circuit 4 which is provided in a latter stage of the pulse transmission circuit 7a and the pulse transmission circuit 7b and does not change an output S_H and R_H when both the on-pulse transmission signal HON and the off-pulse transmission signal HOFF are input; and the latch circuit 5 outputting the signal Q_H synchronized with the output of the logic filter circuit, wherein the pulse transmission circuit 7a includes the impedance adjusting part 8a reducing the signal level of the on-pulse transmission signal HON during the dV/dt period, and the pulse transmission circuit 7b includes the impedance adjusting part 8b reducing the signal level of the off-pulse transmission signal HOFF during the dV/dt period.

According to the above configuration, the semiconductor device drive circuit HVIC1 reduces the signal levels of the on-pulse transmission signal HON and the off-pulse transmission signal HOFF during the dV/dt period, thereby being able to suppress the erroneous output of the switching element. The on-pulse transmission signal HON and the off-pulse transmission signal HOFF are not input to the dV/dt detection circuit 9, thus the dV/dt period can be stably detected. Accordingly, the semiconductor device drive circuit HVIC1 can stably suppress the erroneous output of the switching element.

C. Embodiment 2

C-1. Configuration

Figure 6:
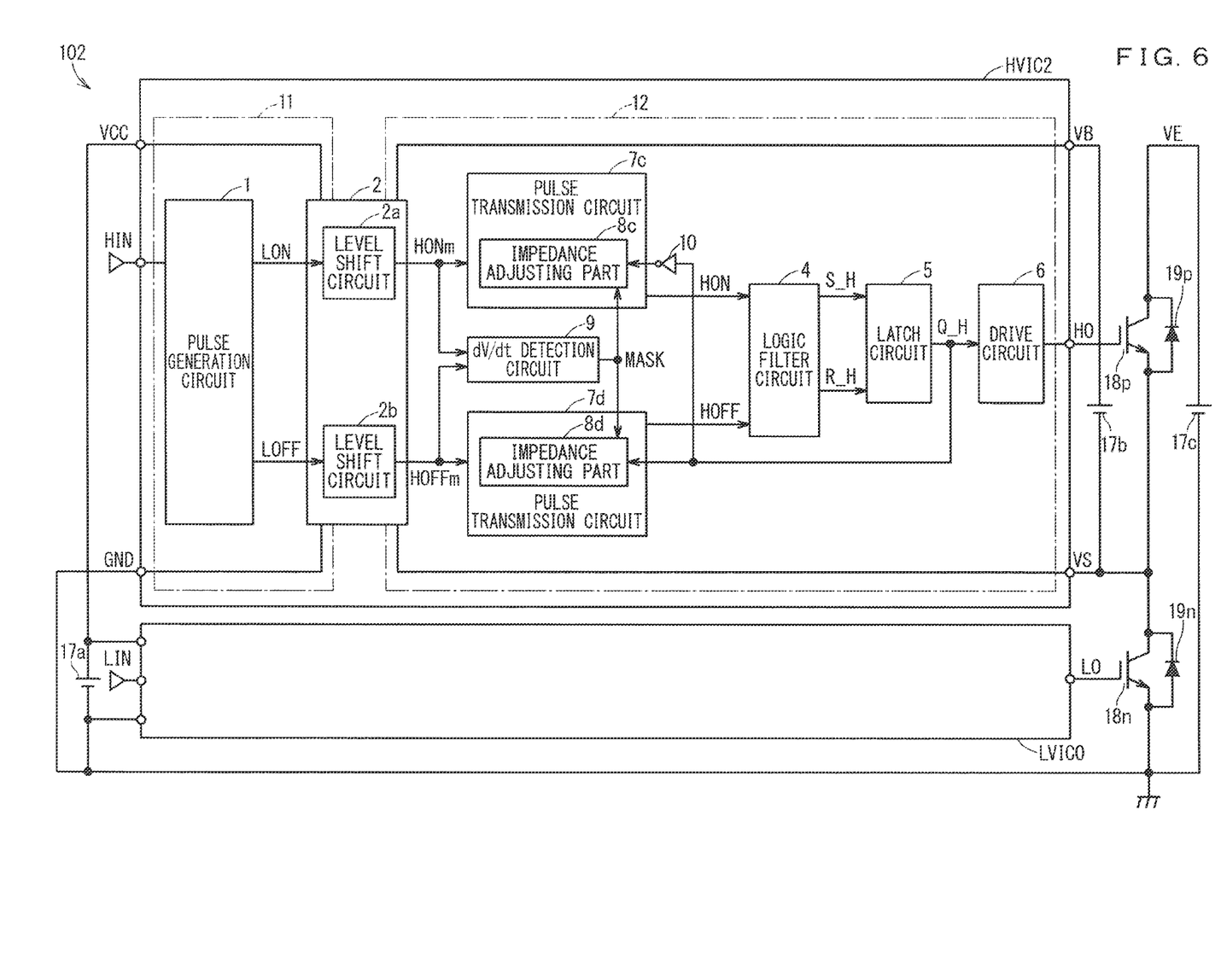
FIG. 6 A circuit block diagram illustrating a configuration of a half-bridge circuit using a semiconductor device drive circuit of an embodiment 2.

FIG. 6 is a circuit block diagram illustrating a configuration of a half-bridge circuit 102 using a semiconductor device drive circuit HVIC2 according to an embodiment 2. The half-bridge circuit 102 is different from the half-bridge circuit 101 according to the embodiment 1 in that the semiconductor device drive circuit HVIC2 is used in place of the semiconductor device drive circuit HVIC1.

The semiconductor device drive circuit HVIC2 includes a pulse transmission circuit 7c in place of the pulse transmission circuit 7a, and includes a pulse transmission circuit 7d in place of the pulse transmission circuit 7b in comparison with the semiconductor device drive circuit HVIC1 according to the embodiment 1. The pulse transmission circuit 7c is also referred to as an on-side pulse transmission circuit, and the pulse transmission circuit 7d is also referred to as an off-side pulse transmission circuit. The pulse transmission circuit 7c includes an impedance adjusting part 8c, and the pulse transmission circuit 7d includes an impedance adjusting part 8d. The impedance adjusting part 8c receives an output Q_H of the latch circuit 5 via a NOT gate 10. The impedance adjusting part 8d receives an output Q_H of the latch circuit 5. The semiconductor device drive circuit HVIC2 is similar to the semiconductor device drive circuit HVIC1 in the other points.

In the semiconductor device drive circuit HVIC2, the impedance adjusting parts 8a and 8b receive the mask signal MASK and Q_H, and determine a state of Q_H. Only the impedance adjusting parts 8a and 8b on a side enabling the change of the state of Q_H are driven to suppress the output of the corresponding pulse transmission circuits 7a and 7b.

Herein, the side enabling the change of the state of Q_H indicates the impedance adjusting part 8b on an off-pulse transmission side when Q_H is HIGH, and indicates the impedance adjusting part 8a on an on-pulse transmission side when Q_H is LOW.

Accordingly, the occurrence of the erroneous signal deriving from dV/dt can be suppressed more reliably.

C-2. Detailed Configuration

Figure 7:
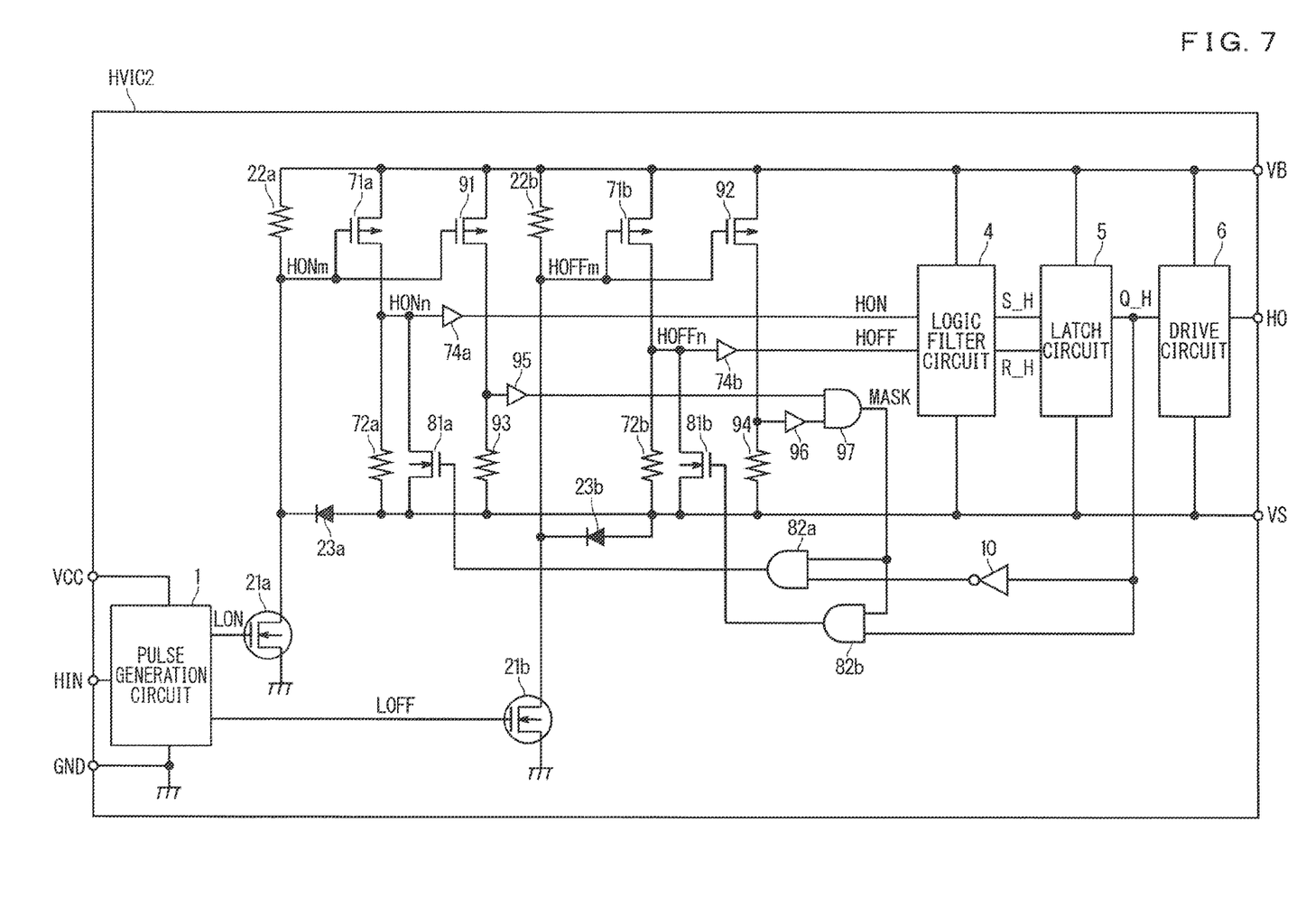
FIG. 7 A circuit diagram of the semiconductor device drive circuit according to the embodiment 2.
Figure 8:
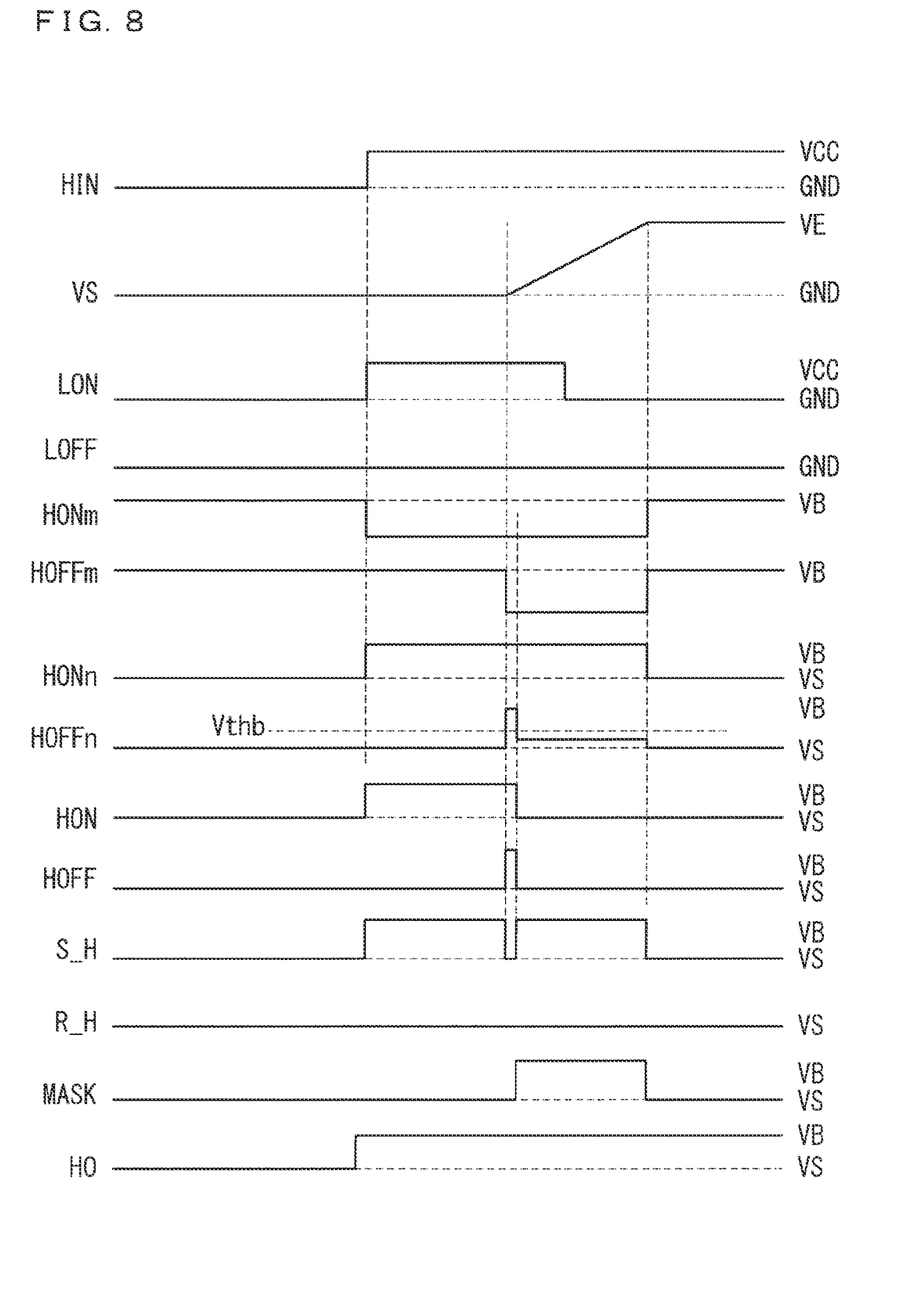
FIG. 8 A diagram illustrating a waveform of each signal at a time of dV/dt in the semiconductor device drive circuit according to the embodiment 2.

FIG. 7 is a circuit diagram of the semiconductor device drive circuit HVIC2. FIG. 8 illustrates a waveform of each signal at the time of dV/dt in the semiconductor device drive circuit HVIC2.

The impedance adjusting part 8c includes an NMOS 81a and an AND gate 82a. A mask signal MASK which is an output of the AND gate 97 is input to one input terminal of the AND gate 82a, and the output Q_H of the latch circuit 5 is input to the other input terminal thereof via the NOT gate 10. An output terminal of the AND gate 82a is connected to a gate of the NMOS 81a.

The impedance adjusting part 8d includes an NMOS 81b and an AND gate 82b. The mask signal MASK which is the output of the AND gate 97 is input to one input terminal of the AND gate 82b, and the output Q_H of the latch circuit 5 is input to the other input terminal thereof. An output terminal of the AND gate 82b is connected to a gate of the NMOS 81b.

In a case where the signal level of the mask signal MASK is HIGH, when Q_H is HIGH, the NMOS 81b becomes conductive and the impedance of the pulse transmission circuit 7d thereby decreases, and when Q_H is LOW, the NMOS 81a becomes conductive, and the impedance of the pulse transmission circuit 7c thereby decreases.

C-3. Effect

In the semiconductor device drive circuit HVIC2 according to the embodiment 2, the pulse transmission circuit 7a and the pulse transmission circuit 7b receive the output signal Q_H of the latch circuit, and when the output signal Q_H of the latch circuit is LOW during dV/dt period, the impedance adjusting part 8a reduces the signal level of the on-pulse transmission signal HON, and when the output signal Q_H of the latch circuit is HIGH during dV/dt period, the impedance adjusting part 8b reduces the signal level of the off-pulse transmission signal HON. Accordingly to the semiconductor device drive circuit HVIC2 having the above configuration, the occurrence of the erroneous signal deriving from dV/dt can be suppressed more reliably.

Each embodiment can be arbitrarily combined, or each embodiment can be appropriately varied or omitted.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device drive circuit, comprising:
    a pulse generation circuit outputting an on-pulse signal synchronized with a leading edge of an input signal and an off-pulse signal synchronized with a falling edge;
    an on-side level shift circuit outputting a level shift on-pulse signal in which a level of reference potential of the on-pulse signal is shifted from primary side reference potential to secondary side reference potential;
    an off-side level shift circuit outputting a level shift off-pulse signal in which a level of reference potential of the off-pulse signal is shifted from the primary side reference potential to the secondary side reference potential;
    an on-side pulse transmission circuit outputting an on-pulse transmission signal based on the level shift on-pulse signal;
    an off-side pulse transmission circuit outputting an off-pulse transmission signal based on the level shift off-pulse signal;
    a dV/dt detection circuit detecting a dV/dt period which is a variation period of the secondary side reference potential based on the level shift on-pulse signal and the level shift off-pulse signal;
    a logic filter circuit which is provided in a latter stage of the on-side pulse transmission circuit and the off-side pulse transmission circuit and does not change an output when both the on-pulse transmission signal and the off-pulse transmission signal are input; and
    a latch circuit outputting a signal synchronized with an output of the logic filter circuit, wherein
    the on-side pulse transmission circuit includes an on-side impedance adjusting part reducing a signal level of the on-pulse transmission signal during the dV/dt period, and
    the off-side pulse transmission circuit includes an off-side impedance adjusting part reducing a signal level of the off-pulse transmission signal during the dV/dt period.

2. The semiconductor device drive circuit according to claim 1, wherein
    the on-side pulse transmission circuit and the off-side pulse transmission circuit receive an output signal of the latch circuit,
    the on-side impedance adjusting part reduces a signal level of the on-pulse transmission signal when the output signal of the latch circuit is LOW during the dV/dt period, and
    the off-side impedance adjusting part reduces a signal level of the off-pulse transmission signal when the output signal of the latch circuit is HIGH during the dV/dt period.

* * * * *